US012683618B2

(12) United States Patent
Rigo et al.

(10) Patent No.: US 12,683,618 B2
(45) Date of Patent: Jul. 14, 2026

(54) CURRENT-OUTPUT DIGITAL-TO-ANALOG CONVERTER

(71) Applicant: ams International AG, Jona (CH)

(72) Inventors: Massimo Rigo, Trieste (IT); Fridolin Michel, Au Zh (CH)

(73) Assignee: AMS INTERNATIONAL AG, Jona (CH)

( * ) Notice: Subject to any disclaimer, the term of this patent is extended or adjusted under 35 U.S.C. 154(b) by 122 days.

(21) Appl. No.: 18/856,070

(22) PCT Filed: Feb. 9, 2023

(86) PCT No.: PCT/EP2023/053152
§ 371 (c)(1),
(2) Date: Oct. 11, 2024

(87) PCT Pub. No.: WO2023/208433
PCT Pub. Date: Nov. 2, 2023

(65) Prior Publication Data
US 2025/0192788 A1     Jun. 12, 2025

Related U.S. Application Data

(60) Provisional application No. 63/334,775, filed on Apr. 26, 2022.

(51) Int. Cl.
*H03M 1/66* (2006.01)
*G01J 1/44* (2006.01)
*H03M 1/06* (2006.01)

(52) U.S. Cl.
CPC ............. *H03M 1/0604* (2013.01); *G01J 1/44* (2013.01); *G01J 2001/442* (2013.01)

(58) Field of Classification Search
CPC ...... H03M 1/0604; H03M 1/66; H03M 1/662; H03M 1/78; G01J 2001/442; G01J 1/44
USPC ................................. 341/144, 154, 118, 120
See application file for complete search history.

(56) References Cited

U.S. PATENT DOCUMENTS

| | | | |
|---|---|---|---|
| 5,489,904 A | 2/1996 | Hadidi | |
| 6,310,520 B1 * | 10/2001 | Walden ................... | H03F 1/486 |
| | | | 330/253 |
| 8,089,380 B2 | 1/2012 | McLachlan | |
| 2009/0135036 A1 | 5/2009 | Werking et al. | |

(Continued)

OTHER PUBLICATIONS

International Search Report issued for the corresponding PCT patent application No. PCT/EP2023/053152, dated May 30, 2023, 3 pages (For informational purposes only).

(Continued)

*Primary Examiner* — Peguy Jean Pierre
(74) *Attorney, Agent, or Firm* — VIERING, JENTSCHURA & PARTNER mbB

(57) ABSTRACT

A circuit includes a digital-to-analog converter (DAC) configured to receive a binary input signal and to provide an output voltage that corresponds to a magnitude of the binary input signal. The circuit further includes a transconductance stage configured to receive the output voltage from the DAC and to generate a DAC current based on a magnitude of the output voltage. The circuit also includes an auxiliary current generator configured to generate an auxiliary current. The DAC current and the auxiliary current are summed together to produce an output current.

16 Claims, 6 Drawing Sheets

(56) References Cited

U.S. PATENT DOCUMENTS

| | | | |
|---|---|---|---|
| 2012/0050080 A1* | 3/2012 | McLachlan | H03M 1/0612 |
| | | | 341/118 |
| 2013/0169462 A1 | 7/2013 | Le et al. | |
| 2025/0070664 A1* | 2/2025 | Ledvina | H02M 3/156 |

OTHER PUBLICATIONS

Chih-Wen, L., et al., "A 10-Bit DAC with 1.6-Bit Interpolation Cells for Compact LCD Column Driver Ics", Journal of Display Technology, 2013, vol. 9, Issue 3, pp. 176-183.
Kledrowetz, V., et al., "An Active Resistor With a Lower Sensitivity to Process Variations, and Its Application in Current Reference", IEEE Access, 2020, vol. 8, pp. 197263-197275.

* cited by examiner

CURRENT-OUTPUT DIGITAL-TO-ANALOG CONVERTER

RELATED APPLICATIONS

This patent application is a US National Stage application, filed under 35 U.S.C. § 371, of International Application PCT/EP2023/053152, filed on Feb. 9, 2023, and claims priority under from U.S. Patent Application 63/334,775, filed Apr. 26, 2022, the contents of the above applications are hereby incorporated by reference.

BACKGROUND

Digital-to-analog converters (DACs) are widely used in many applications to process incoming digital signals and convert them into the analog domain. A given DAC can be configured as a voltage-output DAC or a current-output DAC. Both of these DAC types are similar, in that they both produce an output that is a function of a digital input code. A main difference between the two DAC types is that voltage-output DACs utilize a resistive or capacitive network to convey a digital quantity (as represented by the input code) in the form of a voltage, while current-output DACs utilize fully decoded steered current sources to convey the digital quantity in the form of a current. Current-output DACs can be used in any number of applications, but are commonly used in high speed applications, due to their ability to drive low output impedances. However, there remain non-trivial issues associated with current-output DACs.

BRIEF DESCRIPTION OF THE DRAWINGS

Features and advantages of embodiments of the claimed subject matter will become apparent as the following Detailed Description proceeds, and upon reference to the Drawings, in which:

FIG. 1b illustrates the adverse effect of temperature and/or process variations may have on the output current range of the current-output DAC of FIG. 1a;

Figure 1A:
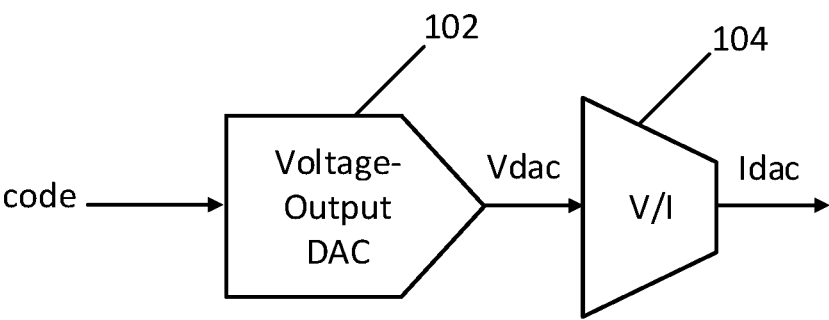
FIG. 1a illustrates a block diagram of an example current-output DAC, configured in accordance with an embodiment of the present disclosure.

Although the following Detailed Description will proceed with reference being made to illustrative embodiments, many alternatives, modifications, and variations thereof will be apparent in light of this disclosure.

DETAILED DESCRIPTION

A current-output DAC is disclosed. Although the DAC design can be used in any number of applications, it is particularly useful in applications that call for an extended output current range. As will be explained in turn, note that such an extended output current range can be achieved without modifying the transfer characteristic gain or the least significant bit (LSB) size of the DAC, according to some embodiments. In an example according to the present disclosure, the current-output DAC includes a voltage-output DAC with a resistor string, followed by a transconductor or voltage-to-current converter stage to generate a first current. In some such embodiments, this first current can be used as the output current of the DAC. In other such embodiments, such as those where output current range of the DAC is susceptible to changes due to temperature and/or process variations, the current-output DAC further includes an auxiliary current generator that produces a second current that is summed with the first current to provide the output current. As will be appreciated in light of this disclosure, summing the first current with the second extends the range of the DACs output current and compensates for temperature and/or process variations. Note that each of the second current and the resulting output current can be arbitrarily scaled by a constant, to accommodate a given application. The auxiliary current generator is correlated with both the voltage-output DAC and the voltage-to-current converter stage such that process/temperature variations affect each of the components in a substantially equal manner. According to some such embodiments, the second current produced by the auxiliary current generator acts as the most significant bit (MSB) portion of the total current output, or a combination of the highest-weighted bits. Other advantages and embodiments will be apparent in light of this disclosure.

General Overview

As noted above, there remain non-trivial issues associated with current-based DACs. For example, the output current range from a current-output DAC tends to be highly sensitive to process and temperature variations, which can make such DACs unreliable in certain applications. In more detail, the output current from the current-output DAC is substantially linearly dependent on the magnitude of the input digital signal, making the current range roughly equal to the difference between the output current for the maximum input digital signal and the output current for the minimum input digital signal. However, this range can end up lower than expected due to various semiconductor process variations that occur during manufacturing process and/or temperature variations that occur during operation. Such an impact on output current range can have negative consequences for some applications. For example, an incorrect current output range can cause errors in downstream processing, which can cause certain applications to fail or not function properly. In one particular example, a current-output DAC may be used to compensate for leakage current in a photon counter, and an incorrect output current range from the DAC will not adequately compensate for the leakage current, which may in turn cause counting errors. One possible solution to boost the output current range from the DAC involves adjusting or trimming the transconductor gain to achieve the required range, while another possible solution includes the use of additional active circuitry to reduce process and temperature variations from the resistors. But such solutions would require a relatively large chip area to implement and/or adversely affect the DAC LSB granularity, and thus may not be appropriate for all applications.

Thus, current-output DAC designs are provided herein, including a current DAC design with an increased output current range. The current-output DAC utilizes a voltage-output DAC coupled with a transconductance stage to convert the voltage output from the voltage-output DAC to a current, according to an embodiment. In some such example cases, the range of this DAC output current is boosted using an auxiliary current generator that is correlated with the voltage-output DAC to ensure that process/temperature variations affect both substantially equally. The generated auxiliary current may be scaled before it is added to the DAC current. By generating a separate correlated current (Iaux) to add to the DAC current (Idac), the LSB granularity and gain of the DAC remain consistent over a relatively large output current range. The current-output DAC with increased output current range is especially useful in applications where outputting a lower-than-expected current is detrimental. One such example is using the current-output DAC to generate a current that compensates for leakage current produced by a photodetector.

According to some embodiments, the voltage-output DAC includes a buffer stage to generate a current through a resistor string having outputs coupled to a multiplexer. The multiplexer is controlled via select lines that receive the input digital signal or code in order to select an output voltage corresponding to the input digital signal. According to some embodiments, an auxiliary current generator includes a first transistor with a gate node that is coupled to a gate node of a second transistor in the buffer stage of the voltage-output DAC. The voltage output from the voltage-output DAC is received by a transconductance stage that includes both (1) a resistor matched to the resistor string and (2) a series of current mirrors to transform the voltage into a DAC current output. According to some embodiments, the transconductance stage also receives the auxiliary current produced by the first transistor and adds a scaled version of this auxiliary current to the DAC current output to produce the final output current with an extended range due to the addition of the auxiliary current. The final output current may also be scaled using a current mirror arrangement, according to some embodiments.

In one specific embodiment, a circuit includes a voltage-output DAC, a transconductance stage, and an auxiliary current generator. The voltage-output DAC is designed to receive a binary input signal and to provide an output voltage associated with a magnitude of the binary input signal. The transconductance stage is designed to receive the output voltage from the voltage-output DAC and to generate a DAC current based on a magnitude of the output voltage. The auxiliary current generator is designed to generate an auxiliary current that, in some examples, corresponds to a string current used within the voltage-output DAC. The resulting DAC current and the auxiliary current are summed together to produce an output current having an extended range, relative to the DAC current provided by the transconductance stage.

In another embodiment, a current-output DAC circuit having an extended output current range includes a voltage-output DAC, a transconductance stage, and an auxiliary current generator. The voltage-output DAC is designed to receive a binary input signal and includes a multiplexer, a resistor string, and a buffer stage. The buffer stage includes a first transistor designed to provide a string current across the resistor string. The transconductance stage is designed to receive an output voltage from the voltage-output DAC and to generate a DAC current based on a magnitude of the output voltage. The auxiliary current generator includes a second transistor having a gate node coupled to a gate node of the first transistor. The second transistor is designed to provide an auxiliary current. The DAC current and the auxiliary current are summed together to produce an output current of the current-output DAC circuit, the output current having an extended relative to the DAC current provided by the transconductance stage.

In another embodiment, a photon counting system includes a photon detector designed to generate a current pulse in response to receiving one or more photons, a current-output DAC configured to compensate for a leakage current associated with the photon detector, front-end circuitry designed to convert the current pulse into a voltage pulse, a discriminator circuit that includes a plurality of comparators and designed to receive the voltage pulse and determine a relative amplitude of the voltage pulse, and one or more counters designed to count a number of received voltage pulses having different heights. The current-output DAC includes a voltage-output DAC, a transconductance stage, and an auxiliary current generator. The voltage-output DAC is designed to receive a binary input signal and to provide an output voltage associated with a magnitude of the binary input signal. The transconductance stage is designed to receive the output voltage from the voltage-output DAC and to generate a DAC current based on a magnitude of the output voltage. The auxiliary current generator is designed to generate an auxiliary current that corresponds to a string current used within the voltage-output DAC. The resulting DAC current and the auxiliary current are summed together to produce an output current used to compensate for the leakage current.

Numerous variations and alternative embodiments will be appreciated in light of this disclosure. The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

Moreover, note that reference to transistor features such as gate, source, or drain is not intended to exclude any transistor technologies. For instance, features such as source, drain, and gate are typically used to refer to a field effect transistor (FET), while emitter, collector, and base are typically used to refer to a bipolar junction transistor (BJT). Such features may be used interchangeably herein, as will be appreciated. For instance, reference to the gate of a transistor may also be understood to refer to either the gate of a FET or the base of a BJT, and vice-versa. Any other suitable transistor technologies can be used. As will be further appreciated, any such transistors can be used as a switch, with the gate or base or other comparable feature acting as a switch select input that can be driven to connect the source and drain (or the emitter and collector, as the case may be).

Current-Output DAC Configuration

Figure 1B:
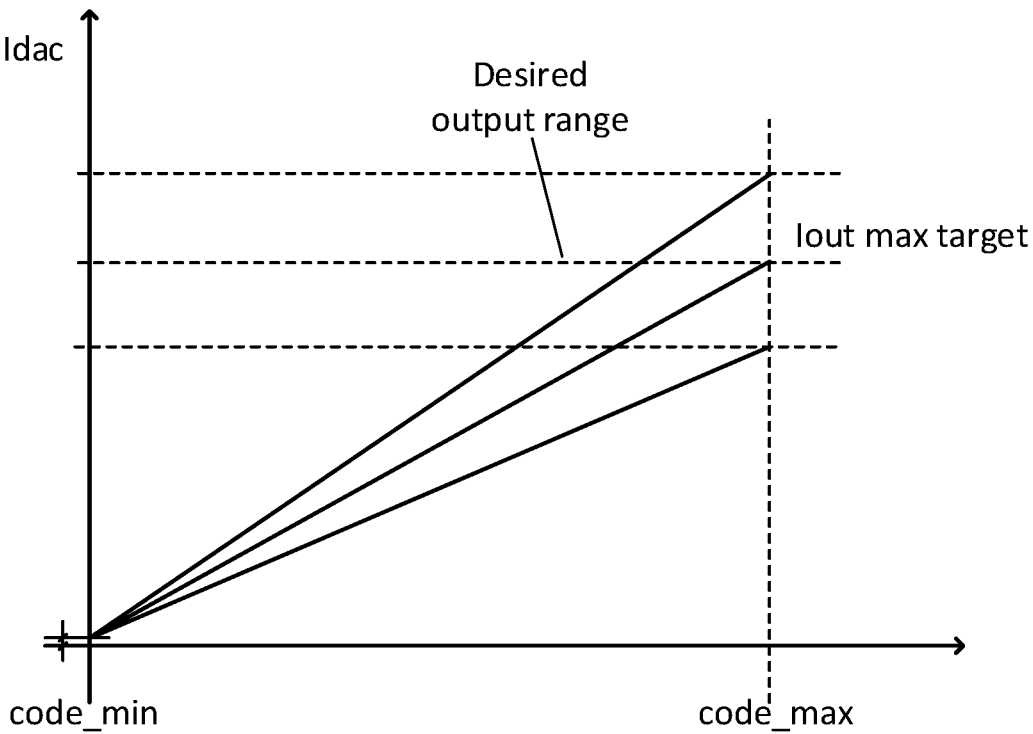

As noted above, the output current range from a current-output DAC is dependent upon the range of input digital signals (e.g., binary codes) and also manufacturing process variation and/or operating temperature variations. FIG. 1a illustrates a block diagram of an example current-output DAC, configured in accordance with an embodiment of the present disclosure. As can be seen, the current-output DAC includes a voltage-output DAC 102 followed by a transconductor or voltage-to-current converter 104. In operation, a digital input code is received at the input of DAC 102, which causes DAC 102 to generate a corresponding output voltage (Vdac). The output voltage Vdac is received at the input of transconductor 104, which causes transconductor 104 to generate a corresponding current output (Idac). FIG. 1b illustrates an example graph of output current (Idac) over a range of received digital input codes from code_min to code_max, for the current-output DAC of FIG. 1a. The output current is substantially linearly dependent on the magnitude of the received digital signal due in part to the closed loop feedback operation in the transconductor 104. The current range output from the current-output DAC is generally provided by Iout (code_max)-Iout (code_min). In some examples, the current output at code_min is at or near zero, which makes the output current range substantially equal to Iout (code_max).

The expected Iout target when code_max is received is shown with the middle dashed line. This is achieved in the ideal scenario represented by the middle data line. However, process and temperature variations can cause the current output to shift up or down. The upper data line represents a scenario where the output current increased due to these variations and still remained within the desired current output range (e.g., above the middle dashed line). However, the lower data line represents a scenario where the output current decreased due to these variations. If the output current is less than expected, this can cause determinantal effects to many applications. In such cases, a current-output DAC design configured with an auxiliary current generator as variously provided herein can be used to ensure that the desired output current range is maintained, despite variations in manufacturing process and/or operating temperature.

Figure 2:
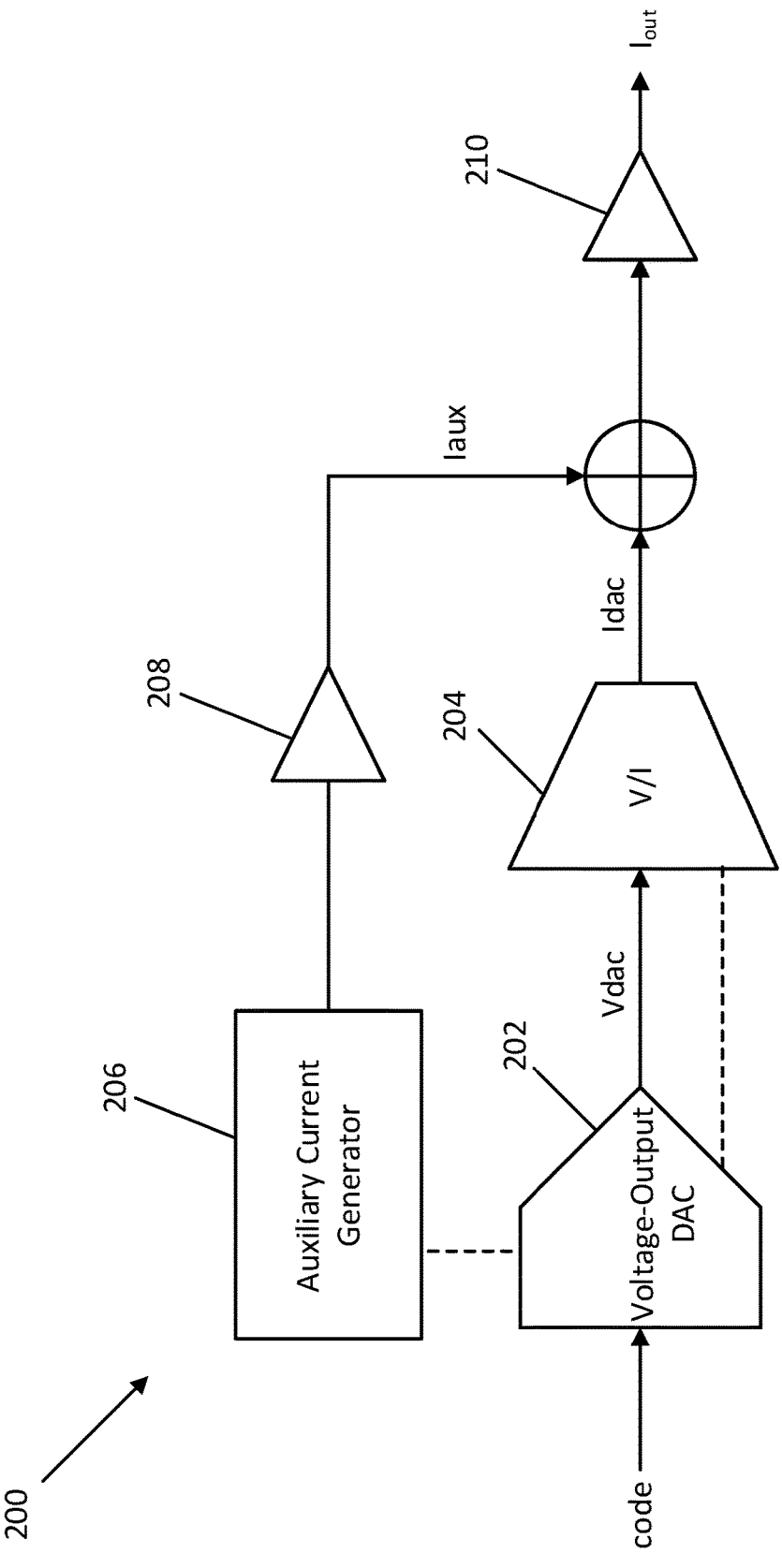
FIG. 2 illustrates a block diagram of another example current-output DAC configured to be less susceptible to changes in output current range due to temperature and/or process variations, in accordance with an embodiment of the present disclosure.

FIG. 2 illustrates a DAC circuit 200 having an extended output current range, according to another embodiment of the present disclosure. DAC circuit 200 includes a voltage-output DAC 202, a transconductance stage 204, and an auxiliary current generator 206. The voltage-output DAC 202 is correlated with both the transconductance stage 204 and the auxiliary current generator 206 (generally indicated with dashed lines), such that process and temperature variations affect each of the components in a substantially equal manner, in some examples. As can be further seen in this example, DAC circuit 200 further includes a first gain stage 208 and a second gain stage 210. Voltage-output DAC 202 receives a digital signal input (e.g., binary code input) and outputs an analog voltage signal Vdac corresponding to a magnitude of the received code input. Transconductance stage 204 receives Vdac and uses one or more current mirrors coupled to one or more resistors to transform the voltage into an output current Idac. As can be seen, transconductance stage 204 can be implemented as an operational transconductance amplifier, which is a voltage-to-current converter such that Idac equals Gm*Vdac where Gm is the transconductance gain.

According to some embodiments, auxiliary current generator 206 produces an auxiliary current Iaux that corresponds to the current produced within voltage-output DAC 202 through its string of resistors, as discussed in more detail with reference to FIG. 3. In some examples, the auxiliary current correlates to the LSB (step) size of the voltage DAC. Accordingly, process and/or temperature variations that affect the operation of voltage-output DAC 202 (and its string current) will also affect the operation of auxiliary current generator 206 (and its auxiliary current Iaux) in substantially the same way. As can be further seen in this example, first gain stage 208 may be used to adjust Iaux by a constant. Note the constant may provide fractional gain (less than 1) so as to scale downward, or amplifying gain (greater than one) so as scale upward, or unity gain (gain of 1). In some embodiments, auxiliary current generator 206 includes a transconductor to generate the auxiliary current Iaux. One such example of a transconductor is a field effect transistor, as discussed in more detail with reference to FIG. 3.

As can be further seen in this example embodiment, Idac is added to Iaux and the resultant summed current Iout can be amplified by a constant at second gain stage 210. Due to the addition of Iaux, Iout has an extended range compared to Idac. Each of the components of DAC circuit 200 may be, for instance, included on a single chip or within a single chip package. In other embodiments, components of DAC circuit 200 may be populated on a printed circuit board.

Figure 3:
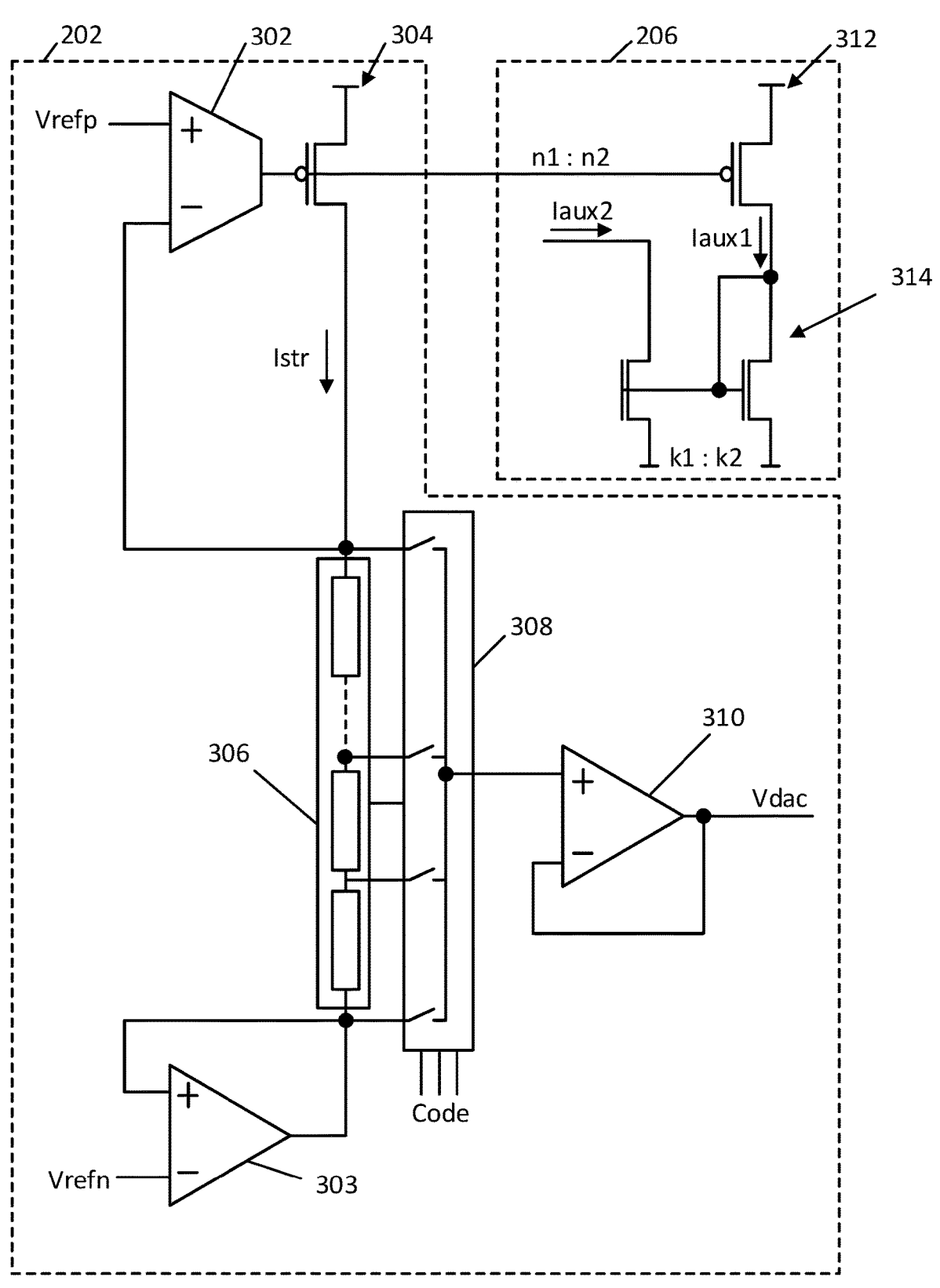
FIG. 3 illustrates a schematic diagram of a voltage-output DAC and an auxiliary current generator from FIG. 2, in accordance with some embodiments of the present disclosure.

FIG. 3 illustrates a more detailed circuit schematic of the voltage-output DAC 202 and auxiliary current generator 206, according to some embodiments. Voltage-output DAC 202 may include a first buffer stage that receives a reference voltage Vrefp at the positive input of an operational transconductance amplifier 302 to set the positive voltage reference of resistor string 306. The output of operational transconductance amplifier 302 is coupled to a gate node of a first transistor 304, which in this example case is a FET, to produce a string current Istr that flows across a resistor string 306. The negative reference voltage Vrefn of resistor string 306 is received at operational amplifier 303 at a second buffer stage, such that the string current Istr is equal to (Vrefp−Vrefn)/Rstring, where Rstring is the combined resistance from the series of resistors in resistor string 306.

According to some embodiments, resistor string 306 includes a series of resistors to produce various voltage levels between each of the resistors in the string. Each of the various voltage levels are coupled to inputs of a multiplexer 308 having select lines that receive the digital code (e.g., 3-digit binary code, but any digital code can be used). Accordingly, the received digital code selects one of the voltage levels produced by string current Istr flowing across resistor string 306. The selected voltage is buffered using operational amplifier 310 and is output as Vdac.

According to some embodiments, the gate node of first transistor 304 within voltage-output DAC 202 is also coupled to a gate node of a second transistor 312 within auxiliary current generator 206. In some example embodiments, first transistor 304, having a width/length (W/L) ratio represented by n1, and second transistor 312, having a W/L ratio represented by n2, are matching transistors (e.g., have the same W/L ratios, or ratios within 0.5% of one another). In the example where n1=n2, then the current Iaux1 provided by second transistor 312 is substantially equal to the string current Istr provided by first transistor 304. In some other example embodiments Iaux1 is a scaled version of Istr based on the difference between the W/L ratios of first transistor 304 and second transistor 312. In such cases, note that Iaux1 can be scaled up or down, depending on whether n2 is greater than or less than n1.

According to some embodiments, auxiliary current generator 206 also includes a current mirror arrangement 314 having transistors with a first W/L ratio (k1) and a second W/L ratio (k2) to provide a scaling factor to Iaux1. Accordingly, in an example where k1=k2, then Iaux2 is equal to Iaux1. In other examples, Iaux2 is a scaled version (up or down) of Iaux1 based on the ratio between k1 and k2. In some embodiments, Iaux2 has an opposite sign from Iaux1.

Figure 4:
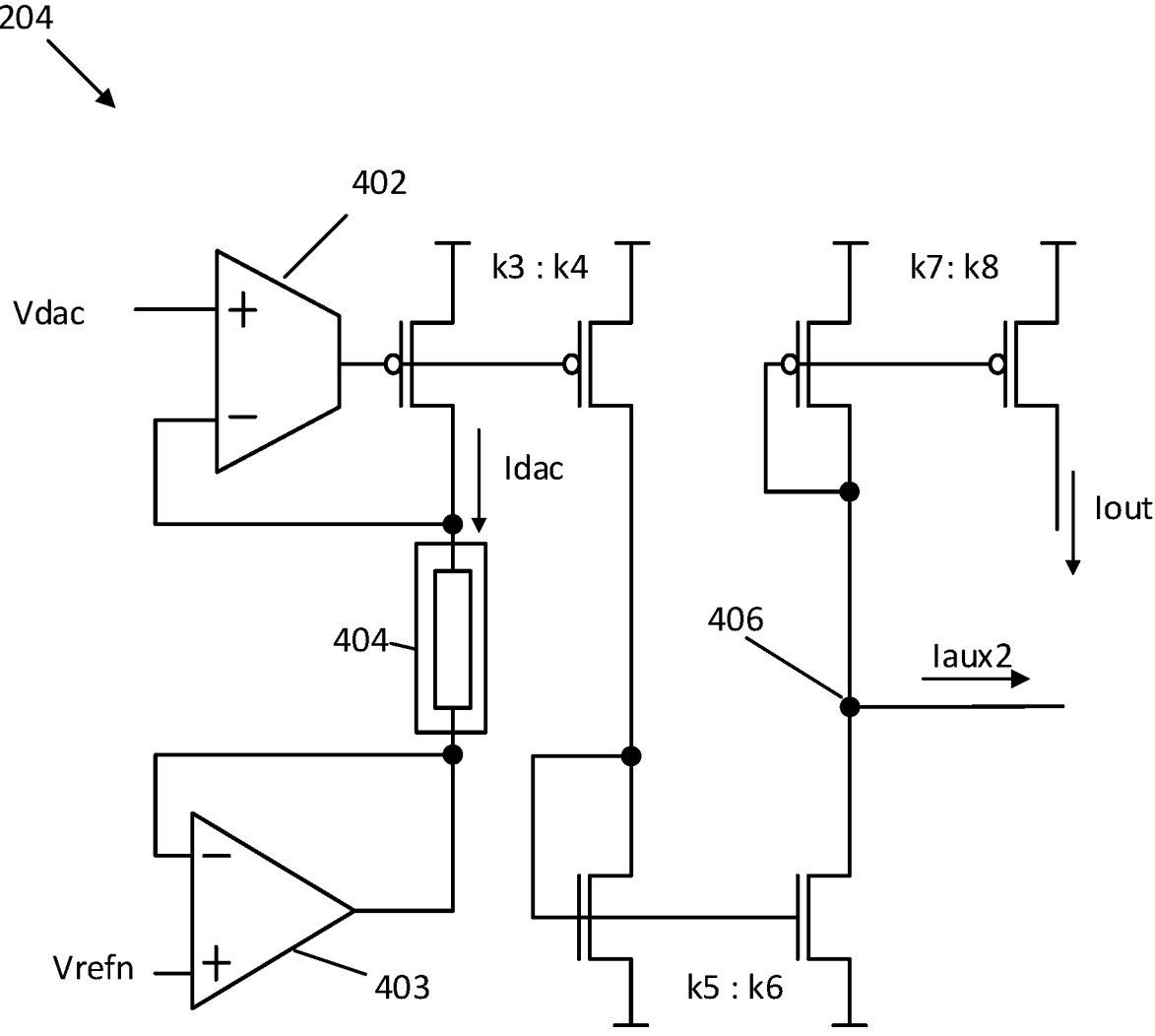
FIG. 4 illustrates a schematic diagram of a voltage-to-current transconductance stage from FIG. 2, in accordance with an embodiment of the present disclosure.

FIG. 4 illustrates a more detailed circuit schematic of transconductance stage 204, according to some embodiments. Transconductance stage 204 receives the voltage output (Vdac) from voltage-output DAC 202 at a first buffer stage having, for example, operational transconductance amplifier 402. The lower voltage reference Vrefn is received at a second buffer stage having, for example, operational amplifier 403. The output of operational transconductance amplifier 402 is received at the gate nodes of two linked transistors having a first W/L ratio (k3) and a second W/L ratio (k4). The first transistor having the first W/L ratio k3 produces the current Idac through a resistor 404 that substantially corresponds to the series resistance of resistor string 306 from voltage-output DAC 202. Accordingly, Idac is equal to (Vdac−Vrefn)/Rdac, where Rdac is the resistance of resistor 404 and substantially equal to Rstring. Depending on the ratio between k3 and k4, Idac or a scaled version of Idac also flows into another current mirror with two linked transistors having a first W/L ratio (k5) and a second W/L ratio (k6). The mirrored current resulting from this current mirror is added with the auxiliary current Iaux2 produced by auxiliary current generator 206 at node 406. If k3=k4 and k5=k6, then Iaux2 is combined with Idac at node 406. Otherwise, some scaled version of Idac is combined with Iaux2 at node 406. The combined currents may pass through another current mirror arrangement with two linked transistors having a first W/L ratio (k7) and a second W/L ratio (k8), according to some embodiments.

According to some such embodiments, based on the various current mirror arrangements to provide current scaling, the total range of the final output current Iout is given by equation 1 below.

$$\frac{\left(\frac{(Vrefp - Vrefn)*k4*k6}{Rdac*k3*k5} + \frac{Iaux1*k1*n2}{k2*n1}\right)*k8}{k7} \qquad (1)$$

As can be seen, equation 1 provides the magnitude of the current range as it considers the difference between the maximum voltage output from the voltage-output DAC (Vrefp) and the minimum voltage output from the voltage-output DAC (Vrefn). Determining the output current Iout for a given DAC voltage Vdac can be performed by replacing Vrefp with Vdac in equation 1.

The transistors from the circuit schematics in FIG. 3 or FIG. 4 are illustrated as either p-channel or n-channel FETs. However, this is only one example and transistors of any type can be used throughout.

Figure 5:
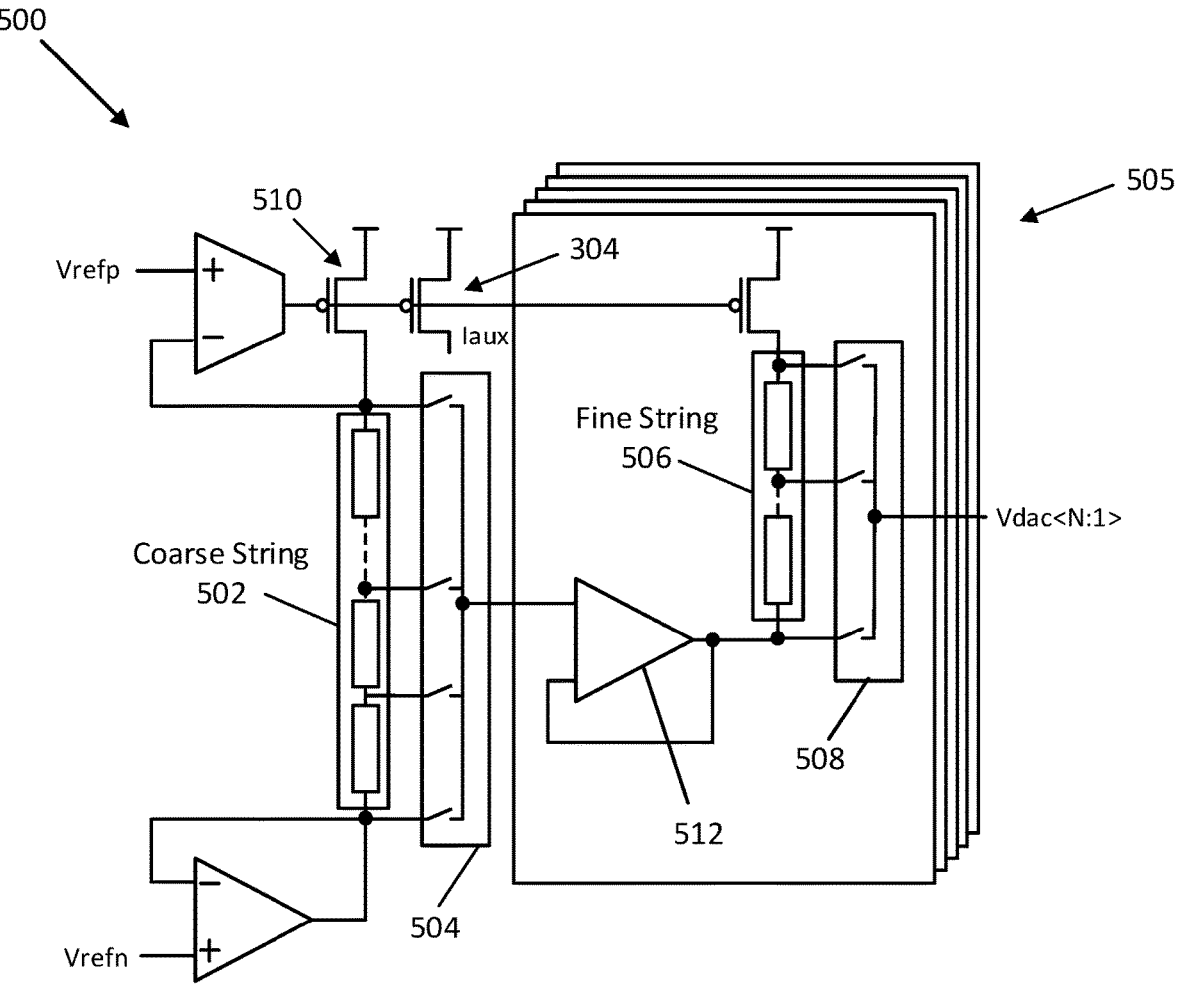
FIG. 5 illustrates a schematic diagram using a coarse-fine DAC and the auxiliary current generator from FIG. 2, in accordance with an embodiment of the present disclosure.

The auxiliary current generator 206 may be used with many different types of voltage-output DAC designs. FIG. 5 illustrates an example coarse-fine voltage-output DAC 500 that utilizes transistor 304 to provide an auxiliary current Iaux as discussed above, according to an embodiment. Coarse-fine voltage-output DAC 500 (also known as a two-step voltage-output DAC) is similar in operation to voltage-output DAC 202, except that it uses two stages of resister strings, each coupled to a corresponding multiplexer. As can be seen, a first coarse stage includes a coarse resistor string 502 coupled to a coarse multiplexer 504 that operates in the same way as resister string 306 and multiplexer 308 from FIG. 3. The output from the coarse stage is buffered via operational amplifier 512 (similar to operational amplifier 310) and received by a plurality of fine stages 505 each including a fine resistor string 506 coupled to a fine multiplexer 508. The coarse-fine voltage-output DAC 500 ultimately produces a voltage output (Vdac) having a finer granularity or resolution than that produced from voltage-output DAC 202. The voltage is converted into a current using the same transconductance stage 204, according to some embodiments.

Coarse-fine voltage-output DAC 500 includes the same auxiliary current generator 206 having transistor 304 coupled to coarse-fine voltage-output DAC 500, according to some embodiments. As discussed above, the gate node of transistor 304 is coupled to the gate node of transistor 510 within a first buffer stage of coarse-fine voltage-output DAC 500. Due to the correlation between transistors 304 and 510, process and/or temperature variations affect the current output from each of the transistors substantially equally. The auxiliary current produced by transistor 304 in coarse-fine voltage-output DAC 500 can be scaled and added to the transconductance current (Idac) resulting from the coarse-fine DAC output voltage (Vdac) to generate the final output current with an extended range (e.g., the sum of Iaux and Idac) in the same way as shown above in FIG. 4.

Figure 6:
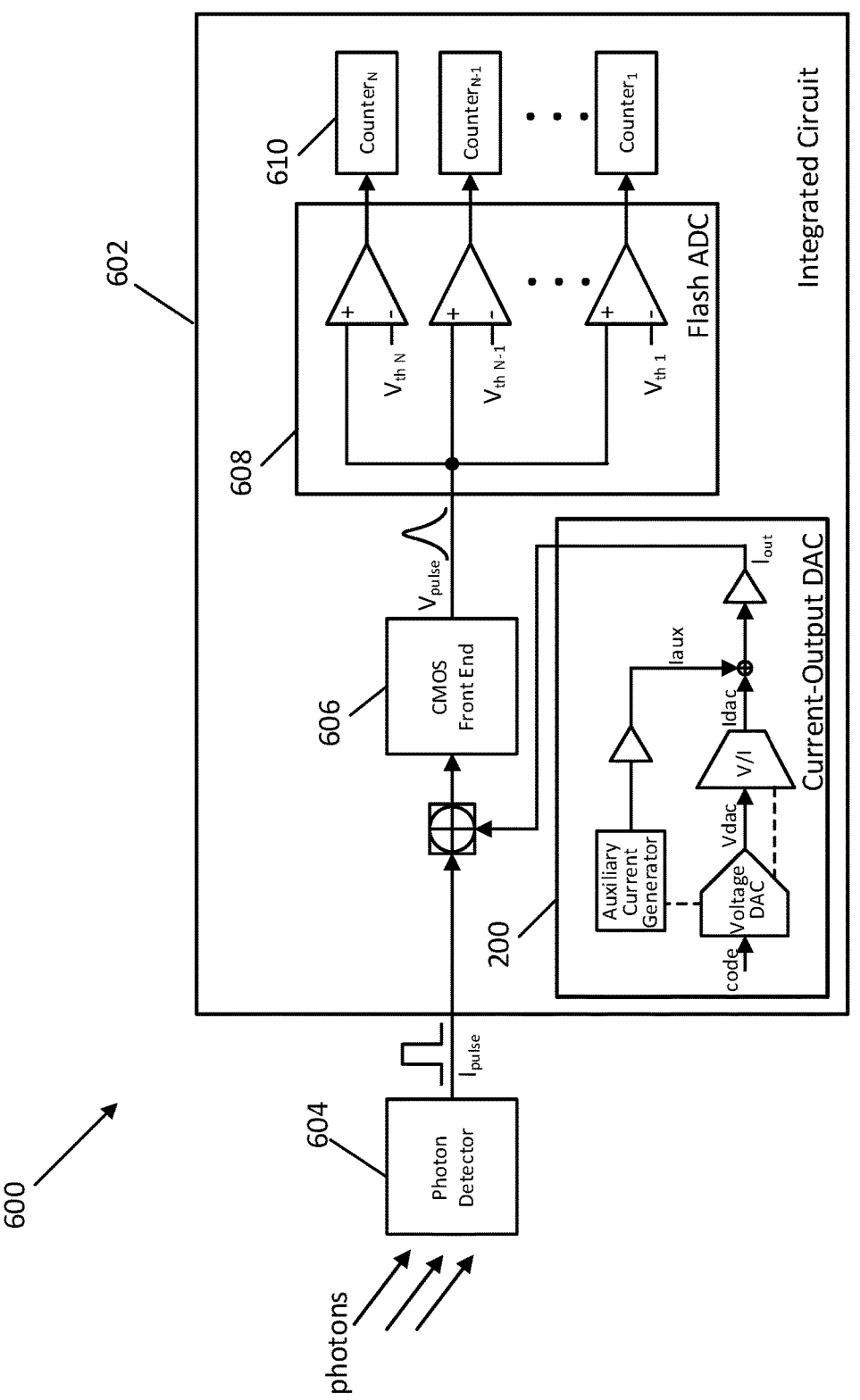
FIG. 6 illustrates a block diagram for a photon counting system that incorporates the current-output DAC from FIG. 2, in accordance with an embodiment of the present disclosure.

Current-output DACs find many uses in high-speed applications and may be used to compensate for leakage currents in sensor devices. FIG. 6 illustrates an example photon counting system 600 that includes an integrated circuit (IC) 602 and a photon detector 604. The process technology by which IC 602 is formed may be, for example, complementary metal oxide semiconductor (CMOS), although other process technologies can be used as well. The photon detector 604 may include, for example, any number of special material layers that convert photons having a particular energy into charge. When a photon strikes the material in photon detector 604, a square wave current pulse may be generated. In some embodiments, photon detector 604 is configured with material suited for generating charge when photons having x-ray energy impinge the material, although any spectrum of radiation can be detected for a given application.

The generated current pulses from photon detector 604 are received by front end circuitry 606. In some embodiments, front end circuitry 606 is designed to filter the received current pulses and convert the current pulses into output voltage pulses. The output voltage pulses are received by a discriminator 608 that includes a plurality of operational amplifier comparators that compare the received voltage pulses to different pre-determined voltage levels ($V_{th}$ 1-$V_{th\ N}$). A series of counters 610 are used to track the heights of the received voltage pulses depending on how they compare with the pre-determined voltage levels. The various received voltage pulse heights correspond to a number of received photons at photon detector 604, according to some embodiments.

According to some embodiments, photon detector 604 may also generate leakage current which may be any generated current that is different from the photon current. This leakage current should be compensated in some way, otherwise it may lead to false photon counts. Thus, and in accordance with some embodiments, current-output DAC circuit 200 having an extended output current range is included on IC 602 to provide an output current that can compensate for any leakage current produced by photon counter 604. The output current (Iout) from DAC circuit 200 is added to any leakage current from photon detector 604 before the current is received by CMOS front end 606, according to some embodiments.

IC 602 may represent a single chip of silicon or other semiconductor material, or may represent a system-on-chip architecture. In some other examples, the components of IC 602 can be fabricated on multiple chips that are packaged together in a multi-chip package.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., non-volatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

What is claimed is:

1. A circuit comprising:
    a digital-to-analog converter (DAC) configured to receive a binary input signal and to provide an output voltage that corresponds to a magnitude of the binary input signal, the DAC comprising a resistor string and a buffer stage comprising a first transistor configured to generate a string current that passes through the resistor string, the resistor string being configured to deliver an output voltage in accordance with the binary input signal;
    a transconductance stage configured to receive the output voltage from the DAC and to generate a DAC current based on a magnitude of the output voltage; and
    an auxiliary current generator comprising a second transistor having a gate node coupled to a gate node of the first transistor, the second transistor being matched to the first transistor, the auxiliary current generator configured to generate an auxiliary current;
    wherein the DAC current and the auxiliary current are summed together to produce an output current.

2. The circuit of claim 1, wherein the DAC comprises a multiplexer having a plurality of inputs coupled along the resistor string and selection inputs configured to receive the binary input signal.

3. The circuit of claim 2, further comprising a mirror to generate the DAC current based on a replica of the current Idac and to supply the DAC current to a node for adding the auxiliary current to the DAC current.

4. The circuit of claim 1, wherein the transconductance stage comprises a resistor matched to a combined resistance of the resistor string.

5. The circuit of claim 1, wherein the auxiliary current generator comprises a current mirror having a first transistor with a first width/length (W/L) ratio and a second transistor with a second W/L ratio different from the first W/L ratio, wherein the current mirror is configured to scale the auxiliary current by a constant based on a ratio between the first and second W/L ratios.

6. The circuit of claim 5, wherein the auxiliary current represents a most significant bit (MSB) portion of the output current.

7. The circuit of claim 1, further comprising a gain stage configured to receive the output current.

8. The circuit of claim 7, wherein the gain stage includes a current mirror arrangement having a first transistor with a first width/length (W/L) ratio and a second transistor with a second W/L ratio different from the first W/L ratio, wherein the current mirror is configured to scale the output current by a constant based on a ratio between the first and second W/L ratios.

9. The circuit of claim 1, wherein the DAC is a coarse-fine DAC that includes a coarse stage and a fine stage.

10. The circuit of claim 1, wherein the auxiliary current generator includes a transconductor configured to generate the auxiliary current.

11. A photon counting system comprising:
    a photon detector configured to generate a current pulse in response to receiving one or more photons; and
    a current-output digital-to-analog converter (DAC) configured to compensate for a leakage current associated with the photon detector, the current-output digital-to-analog converter (DAC) comprising a voltage-output DAC configured to receive a binary input signal and to provide an output voltage that corresponds to a magnitude of the binary input signal, the DAC comprising a resistor string and a buffer stage comprising a first transistor configured to generate a string current that passes through the resistor string, the resistor string being configured to deliver an output voltage in accordance with the binary input signal;

a transconductance stage configured to receive the output voltage from the DAC and to generate a DAC current based on a magnitude of the output voltage; and an auxiliary current generator comprising a second transistor having a gate node coupled to a gate node of the first transistor, the second transistor being matched to the first transistor, the auxiliary current generator configured to generate an auxiliary current based on a replica of the string current;

wherein the DAC current and the auxiliary current are summed together to produce an output current.

12. The photon counting system of claim 11, further comprising:

front-end circuitry configured to convert the current pulse into a voltage pulse;

a discriminator circuit comprising a plurality of comparators and configured to receive the voltage pulse and determine a relative amplitude of the voltage pulse; and one or more counters configured to count a number of received voltage pulses having different heights.

13. A digital-to-analog converter (DAC) circuit, comprising:

a voltage-output DAC configured to receive a binary input signal and generate a corresponding output voltage, the voltage-output DAC comprising a multiplexer, a resistor string, and a buffer stage, wherein the buffer stage includes a first transistor configured to provide a string current across the resistor string;

a transconductance stage configured to receive the output voltage from the voltage-output DAC and to generate a DAC current based on a magnitude of the output voltage; and an auxiliary current generator comprising a second transistor configured to provide an auxiliary current based on a replica of the string current;

wherein the DAC current and the auxiliary current are summed together to produce an output current.

14. The DAC circuit of claim 13, wherein the multiplexer comprises a plurality of inputs coupled along the resistor string and selection inputs configured to receive the binary input signal.

15. The DAC circuit of claim 13, wherein a gate node of the first transistor is coupled to a gate node of the second transistor.

16. The DAC circuit of claim 13, further comprising a gain stage configured to receive the output current.

* * * * *